United States Patent [19]

Walker et al.

[11] Patent Number: 5,270,078
[45] Date of Patent: Dec. 14, 1993

[54] METHOD FOR PREPARING HIGH RESOLUTION WASH-OFF IMAGES

[75] Inventors: Peter Walker, Hockessin, Del.; Sheau-Hwa Ma, Chadds Ford, Pa.; Andrew E. Matthews, Leeds, England

[73] Assignee: E. I. Du Pont de Nemours and Company, Wilmington, Del.

[21] Appl. No.: 930,117

[22] Filed: Aug. 14, 1992

[51] Int. Cl.$^5$ .............................................. B05D 5/06
[52] U.S. Cl. ................................... 427/264; 427/273; 427/353
[58] Field of Search ............... 427/264, 270, 273, 145, 427/353

[56] References Cited

U.S. PATENT DOCUMENTS 5,209,814  5/1993  Felten et al. ........................ 156/635

FOREIGN PATENT DOCUMENTS 55-49288  4/1980  Japan .................................. 427/273
1431462  4/1976  United Kingdom .

Primary Examiner—Terry J. Owens

[57] ABSTRACT

A method for preparing high resolution wash-off images, preferably using ink jet printing, comprising the sequential steps of: (a) providing a non-photosensitive layer, preferably on a substrate, wherein the non-photosensitive layer comprises a polymer selected from the group consisting of acid containing polymers having at least 0.4 milliequivalents of acid functions per gram of polymer and amine containing polymers having at least 0.4 milliequivalents of amine functions per gram of polymer, (b) applying an aqueous ink imagewise to the non-photosensitive layer to form a salt of the polymer in the ink applied areas, said aqueous ink comprising an aqueous carrier medium and a salt-forming agent; and (c) washing the non-photosensitive layer with an aqueous solution to remove the imaged areas of the non-photosensitive layer.

15 Claims, No Drawings

METHOD FOR PREPARING HIGH RESOLUTION WASH-OFF IMAGES

FIELD OF INVENTION

The invention relates to a method for preparing high resolution wash-off images from non-photosensitive elements and to elements for use therein.

BACKGROUND OF THE INVENTION

It has long been known in the art that images may be prepared using what is known as a "wash-off" development step in which a latent image is developed by washing with water or other aqueous or non-aqueous developing solution. Such techniques have been widely used in the preparation of flexographic plates, printed circuits, etc. from photosensitive compositions.

Diffusion patterning techniques have also been developed, primarily in the electronics arts, for the preparation of conductors, dielectrics and resistors from photosensitive or non-photosensitive thick films. For example, U.S. Ser. No. 07/768,504, filed Sep. 30, 1991, teaches a method and composition for diffusion patterning in which an unpatterned layer comprising a solid dispersion of a solid organic acid and a plasticizer is patterned with a second layer comprising an organic base and a volatile solvent. After the patterning layer has been applied, such as by screen printing, thermal transfer or ink jet printing, the element is heated to evaporate the solvent and diffuse the organic base into the underlying unpatterned layer. The reaction of the organic base with the acidic polymer renders the latter soluble in the patterned areas. The element is then developed by washing with an aqueous solution having a pH of 5 to 8.5.

Similarly, U.S. Ser. No. 07/790,863, filed Nov. 14, 1991, teaches a method and composition for diffusion patterning in which the unpatterned first layer comprises an acid labile polymer composition and the patterning layer comprises an organic acid and a volatile solvent. After heat is applied to evaporate the solvent and diffuse the organic acid, the acid labile polymer in the patterned areas is susceptible to being washed-off with an aqueous solution having a pH of at least 7.

It is also known in the art that relief images may be prepared from photosensitive or non-photosensitive elements using a wash-off development techniques in which the image or patterned layer is applied with an ink jet printer. British Patent 1 431 462 teaches such a method. More specifically, this reference teaches both positive and negative-working systems for forming a relief image using primarily natural proteinaceous materials. In the negative-working system, a polymer coating (e.g. gelatin) is crosslinked, polymerized, or otherwise imagewise hardened by applying a suitable agent (e.g formaldehyde) using ink jet printing and then dissolving the unhardened areas with a developing solution. In the positive-working system ink jet printing is used to apply an agent (e.g enzyme) which will degrade an otherwise insoluble polymer coatings thus rendering it soluble in the developing solution.

Although desirable in principle, the methods disclosed in the aforementioned British Patent are disadvantageous in practice. First, the natural proteinaceous polymers disclosed in this reference lack many physical characteristics necessary from most relief applications, thus rendering such reliefs of limited practical or commercial utility. Second, the crosslinking and degradation reactions are relatively slow, particularly at room temperature, thus decreasing the efficiency of the process. The patent teaches that heat could be applied to facilitate the reaction, but this requires an additional step and presents other complications. Third, many of the crosslinking agents, such as aldehydes, are environmentally disadvantageous Fourth, the use of photopolymerizable compositions requires an additional exposure step, which increases costs and lowers efficiency. Fifth, many of the developing solutions are organic solvent based, are highly alkaline, or are maintained at elevated temperatures and thus present additional environmental and safety hazards. Sixth, the latent images generated by such methods are not stable, reducing the utility of the process. Finally, the resolution obtainable from these methods was only marginal and often insufficient for demanding commercial applications.

The diffusion patterning methods discussed above require a separate step to evaporate the solvent and diffuse the patterning layer into the unpatterned layer.

The present invention overcomes many of these disadvantages and provides a process which poses minimal environmental risks, is easy to use and has the capability of producing images of high resolution in a very short period of time.

SUMMARY OF THE INVENTION

The invention is directed to a method for preparing high resolution wash-off images comprising the sequential steps of:

(a) providing a non-photosensitive layer, preferably on a substrate, said non-photosensitive layer comprising a substantially non-crystalline polymer selected from the group consisting of acid containing polymers having at least 0.4 milliequivalents of acid functions per gram of polymer and amine containing polymers having at least 0.4 milliequivalents of amine functions per gram of polymer;

(b) applying an aqueous ink imagewise to the non-photosensitive layer to form a salt of the polymer in the ink applied areas, said aqueous ink comprising an aqueous carrier medium and a salt-forming agent; and (c) washing the non-photosensitive layer with an aqueous solution to remove the imaged areas of the non-photosensitive layer.

In another aspect, the present invention comprises a image formed according to the above process.

In still another aspect, the present invention comprises an aqueous solution developable element containing a latent image, said element comprising:

(a) a non-photosensitive layer, preferably on a substrate, said non-photosensitive layer comprising a substantially non-crystalline polymer selected from the group consisting of acid containing polymers having at least 0.4 milliequivalents of acid functions per gram of polymer and amine containing polymers having at least 0.4 milliequivalents of amine functions per gram of polymer; and (b) said non-photosensitive layer containing a latent image in the form of a stable, water-soluble salt of said polymer, said latent image having been formed by imagewise applying an aqueous ink layer to said non-photosensitive layer, said ink comprising an aqueous carrier medium and a salt-forming agent.

In the preferred embodiments, the step of applying the aqueous ink is accomplished by use of an ink jet printer.

DETAILED DESCRIPTION OF THE INVENTION

The present invention offers several advantages over the prior art described above. For example, the present invention is more environmentally sound than the prior art because it utilizes aqueous solutions for pattern formation and element development. Therefore, waste disposal does not require solution treatment as required with solvent based systems and volatile solvent vapors are greatly reduced or eliminated. In addition, the present process does not use potentially toxic monomers, and is safer and easier to use. No additional heating or exposure steps are required and no yellow light area is needed during processing.

Images formed by the present process have surprisingly good resolution and sharp edges. The element can be washed to develop the image immediately after the image layer has been applied, which greatly simplifies the process and improves efficiency. On the other hand, the reaction between the salt-forming agent and the non-photosensitive layer forms stable salts, whereby, if desired, the element can be stored with the latent image intact for an indefinite period of time prior to being developed with an aqueous solution.

SUBSTRATE

In the preferred embodiment, a substrate is used to support the non-photosensitive layer. However, the use of a substrate may be avoided, if desired, by using a film-forming non-photosensitive composition which is self-supporting.

Virtually any substrate which is capable of withstanding the aqueous developing step of the present process may be used in practicing this invention. The substrates may be clear or colored. The selection of a particular substrate will of course depend upon the intended application.

Particularly useful are a wide range of transparent film supports, including glass, cellulose triacetate, polyethylene terephthalate, polystyrene, and polymerized acrylates. Films produced according to U.S. Pat. No. 2,779,684, U.S. Pat. No. 3,052,543, Canadian Patent 562,672 and UK Patent 766,290 are particularly suitable because of their dimensional stability.

In applications such as printing plates, solder masks and printed circuits, the supports may be opaque and contain metal or plastic. Typical substrates for resist applications include combinations such as phenolic or epoxy resins on paper or paper-glass composites, as well as polyester, epoxy, polyimide, polytetrafluoroethylene or polystyrene on glass. In most instances, these substrates are also clad with a thin layer of electroconductive metal of which copper is by far the most common.

Suitable substrates for lithographic printing plates include those disclosed in U.S. Pat. No. 4,072,528; U.S. Pat. No. 3,181,461; U.S. Pat. No. 3,280,734; and U.S. Pat. No. 3,458,311. For thick film paste applications, inorganic substrates such as $Al_2O_3$, $SiO_2$, silicon and AlN are commonly employed.

NON-PHOTOSENSITIVE LAYER

The non-photosensitive layer comprises a polymer selected from the group consisting of acid containing polymers having at least 0.4 milliequivalents of acid functions per gram of polymer and amine containing polymers having at least 0.4 milliequivalents of amine functions per gram of polymer. Of course, any suitable polymer would have to be capable of forming a water-soluble salt when reacted with the aqueous inks discussed hereinbelow. Moreover, the polymers must be insoluble in water in their unreacted (i.e., non-salt) form.

Another requirement is that the polymer be substantially non-crystalline, which means that it have no more than about 50% crystallinity. Such substantial non-crystallinity is essential in order to facilitate the diffusion of the salt-forming agent from the aqueous ink into the non-photosensitive layer.

The non-photosensitive layer need not be homogeneous across the substrate. By this we mean that it is not necessary to employ a single non-photosensitive composition continuously across the substrate. By way of example, it is contemplated that discrete visual areas of the non-photosensitive can be made by using different colorants in the compositions and applying them to the substrate in imagewise fashion using techniques described below. In this manner, for example, the non-photosensitive layer may be imagewise applied to create indicia such as white balloons or clouds on a blue background. The process of this invention would then be used, for example, to generate an image in the white region, the blue region, or both.

It should also be mentioned that the non-photosensitive layer may comprise multiple layers, if desired, and each layer may be a different color or composition to create interesting or unusual visual effects after imaging. It deserves mentioning that when more than one non-photosensitive composition is used, whether they are applied over or adjacent to one another, the two compositions must contain polymers of the same nature (i.e., either both contain acid containing polymers or both contain amine containing polymers).

Acid Containing Polymer

Suitable acid containing polymers for use in the present invention are those that possess an acid number of at least 0.4 milliequivalents per gram of polymer. The acid number of a polymer defines the number of acid functions in milliequivalents (meq) per unit weight of the polymer. It has a direct correlation to the solubility of the polymer in aqueous solutions. To be useful in the present invention, the acid number of a polymer needs to be high enough so that the polymer becomes soluble in water once converted into the salt form by reaction with the salt-forming agent. On the other hand, the acid number should not be so high that the polymer is soluble in water in its acid form. It is known that polymers possessing acid numbers of above about 12.5 meq are water soluble. Therefore the acid containing polymers useful in this invention should not have acid numbers greater than about 10 to 11 meq. Depending on the chemical nature and molecular weight of the polymer, the optimal acid number will vary depending upon the particular acid polymer selected. A useful range would be from 0.4 to 11.0 meq, preferably from 1.0 to about 7.0 meq.

Acid containing polymers which are particularly useful in the present invention are vinyl addition polymers containing free carboxylic acid groups, examples of which include acrylic polymers, styrene acrylic polymers, methacrylic polymers, (α-methyl styrene acrylic copolymers, and styrene maleic anhydride copolymers. These polymers can be easily made by polymerization techniques familiar to those skilled in the art. A convenient method to incorporate the acid functions in a polymer is to polymerize monomers already containing acid or acid precursor functions, such as acrylic acid; methacrylic acid; crotonic acid; itaconic acid; itaconic acid monoester; maleic acid; maleic acid monoester; maleic anhydride; fumaric acid; fumaric acid monoester; and the like.

As is known to those skilled in the art, acid containing monomers can be copolymerized with non-acid containing monomers to adjust the physical properties, including solubility properties of the polymer. Monomers that are particularly useful for this purpose include methyl acrylate, ethyl acrylate, propyl acrylate, n-butyl acrylate, hexyl acrylate, 2-ethylhexyl acrylate, phenyl acrylate, 2-phenylethyl acrylate, hydroxyethyl acrylate, methyl methacrylate, ethyl methacrylate, propyl methacrylate, n-butyl methacrylate, hexyl methacrylate, 2-ethylhexyl methacrylate, phenyl methacrylate, 2-phenylethyl methacrylate, hydroxyethyl methacrylate, styrene, a-methyl styrene, vinyl naphthalene, vinylidene chloride, vinyl acetate, vinyl chloride, and the like.

Examples of commercially available acid containing polymers which can be used to advantage in the present invention include the SMA ® resins from Sartomer Co., West Chester, PA 19382, the Carbose ® resins from the B. F. Goodrich Co., Cleveland, OH 44131, Morcryl ™ resins from Morton Thiokol, Chicago, IL., Nacrylic ® resins from National Starch and Chemical, Bridgewater, NJ., and Joncryl ® resins from Johnson Wax, Racine, WI.

Amine Containing Polymer

Amine containing polymers suitable for use in the present invention must possess a minimum amine value of at least 0.4 meq per gram of polymer. Similar to the acid number, the amine value of a polymer defines the number of amine functions (primary, secondary, tertiary, and the mixtures thereof) in meq per unit weight of the polymer and it has a direct correlation to the solubility of the polymer in aqueous solutions. To be useful in the present invention, the amine value of a polymer needs to be high enough so that the polymer becomes soluble in water after reaction with the salt-forming agent to form the salt. As with the acid containing polymer, the optimal amine value will depend on the chemical nature and molecular weight of the selected polymer, and the other components in the film. A useful range would be from 0.4 to 11.0 meq, preferably from 1.0 to 10.0 meq.

Amine containing polymers which are particularly useful in the present invention are vinyl addition polymers, such as acrylic polymers, methacrylic polymers, styrene acrylic copolymers, and (a-methyl styrene acrylic copolymers which contain free amine groups. The amine groups may be primary, secondary, or tertiary amine groups, or mixtures thereof. Such polymers can be conveniently prepared by polymerization techniques familiar to those skilled in the art, such as by using amine containing monomers. Examples of useful amine containing monomers include N,N-dimethylaminoethyl acrylate, N,N-dimethylaminoethyl methacrylate, N,N-diethylaminoethyl methacrylate, t-butylaminoethyl methacrylate, 2-N-morpholinoethyl acrylate, 2-N-morpholino-ethyl methacrylate, 4-amino styrene, 2-vinylpyridine, 4-vinylpyridine, and the like.

Alternatively, functional monomers or polymers may be reacted with an amine to generate the amine groups on the polymer, e.g. reacting a copolymer of glycidyl methacrylate with dimethylamine.

The amine containing monomers can be copolymerized with non-amine containing monomers described above to adjust the physical properties of the polymer layer, including solubility.

Adjuvants

A variety of adjuvants may be present in the non-photosensitive layer, such as colorants, plasticizers, polymeric modifiers, adhesion promoters and coating aids, depending upon the desired application. In some instances, it may be desirable to partially convert the polymer to the water-soluble salt form to increase its susceptibility to the action of the salt-forming agent. Care should be exercised, however, to ensure that the adjuvants will not interfere with the salt-forming reaction between the polymer and the salt-forming agent in the ink, and that such adjuvants do not render the non-photosensitive composition water-soluble.

Colorants

If a precolored element is desired, one or more colorants can be present in the non-photosensitive layer. Dyes and pigments may be used as colorants. Dyes are known to have superior color properties such as chroma and transparency, but usually are not as light-fast as pigments. Water soluble dyes such as acid dyes, direct dyes, and basic dyes should be avoided because they can be washed off during the development step.

Useful pigments comprise a wide range of organic and inorganic pigments. It is preferable for the pigment particles to be dispersed and stabilized with a dispersant, preferably a polymeric dispersant. A high quality dispersion can be conveniently prepared by one skilled in the art using many conventional milling techniques and selection of a suitable dispersant. Caution should be taken that the dispersant does not contain functional groups which will interact with the functional polymers, as this may impede the interaction between the salt-forming agent and the polymer or adversely affect the coating quality by flocculating the pigment dispersion. Preferably, the dispersant contains similar types of functional groups as the acid or amine containing polymers. Small pigment particle size will be very desirable for maximum color strength, transparency, gloss, and dispersion stability.

The type of colorant and the amount thereof are selected based on the hue, color strength and purity, lightfastness, solubility or dispersability in the chosen coating solvent, and other properties required for the intended applications. A detailed list of commercial dyes and pigments can be found in the "Buyer's Guide For Textile Chemists and Colorists", published by American Associate of Textile Chemists and Colorists, Research Triangle Park, NC.

Plasticizers

In a preferred embodiment, a plasticizer is used to facilitate the penetration of the salt-forming agents and to adjust the film forming properties in the non-photosensitive layer. A plasticizer is selected to have reasonable compatibility with the polymer and other components of the film composition.

Useful plasticizers are well known to those skilled in the art and are commercially available. With acrylic polymers, for example, plasticizers can include dibutyl phthalate and other esters of aromatic acids; esters of aliphatic polyacids such as diisooctyl adipate, and nitrate esters; aromatic or aliphatic acid esters of glycols, polyoxyalkylene glycols, aliphatic polyols; alkyl and aryl phosphates; chlorinated paraffins; and sulfonamides. In general, water insoluble plasticizers are preferred for greater high humidity storage stability and environmental operating latitude, but are not required. The plasticizer may be present in an amount effective for the intended purpose, and the optimal level can be determined experimentally.

Polymeric Modifiers

The non-photosensitive layer composition may contain a second polymeric material to modify adhesion, flexibility, hardness, moisture sensitivity and other mechanical or chemical properties required during its processing or end use. Suitable polymeric binders which can be used in combination with the acid or amine containing polymer include acrylate and methacrylate polymers, e.g., poly(methyl methacrylate), poly(ethyl methacrylate), etc.; vinyl polymers and copolymers, e.g., poly(styrene(70)/methyl methacrylate(30), acrylonitrile/butadiene/styrene, polystyrene, etc.; polyvinyl acetals, e.g. poly(vinyl acetal), poly(vinyl formal), etc.; polyesters, e.g., poly(tetramethylene terephthalate), etc.; condensation polymers, e.g., polycarbonate, polysulfone, polyetherimide, polyphenylene oxide, poly(1,4-cyclohexanedimethanol terephthalate), etc.; butadiene copolymers, e.g., styrene butadiene copolymers, etc.; cellulose esters and ethers, e.g., ethyl cellulose, etc.; and polyurethanes.

For formulations having improved environmental latitude, the selection of a polymeric modifier may depend on its Tg. The Tg of a polymer is affected by the chemical structures of the main chain and the side groups. Polymers with rigid structures generally show high Tgls while more flexible polymers exhibit low Tg's. Polymers of desired Tg's may be obtained by copolymerization of proper combinations of rigid and flexible monomers. The Tgls of many well known polymers are summarized in Section III of "POLYMER HANDBOOK", ed. J. Brandrup & E. H. Immergut, John Wiley & Sons, Inc., 1975, pp. 140-192, which is incorporated herein by reference.

The polymeric modifier may be present in an effective amount for the intended purpose, but the amount should not be too high so as to impede the solubility characteristics of the polymer layer.

The polymeric modifier may be of the same character as the non-photosensitive polymer (i.e., acid containing or amine containing) or it can be neutral. It is particularly advantageous for the polymeric additive to have limited compatibility with the acid or amine containing polymer present in the non-photosensitive layer to create a two-phase layer. The interfaces between the two phases will facilitate diffusion of the salt-forming agent into the polymer layer. Plasticizers may also be used for this function.

Adhesion Promoting Agents

Since the non-photosensitive polymer layer can be used as a coating on a metal surface, a heterocyclic or mercaptan compound may be added to improve adhesion of the polymer layer to the metal. Suitable adhesion promoters are disclosed in U.S. Pat. No. 3,622,334, U.S. Pat. No. 3,645,772, and U.S. Pat. No. 4,710,262.

Depending upon the composition of the non-photosensitive layer, either an aqueous or solvent medium may be used to prepare the composition for coating on the selected substrate. The acid or amine containing polymers can be dissolved in an aqueous solution by reacting them with a volatile salt-forming agent, e.g. ammonium hydroxide for acid containing polymer, which will evaporate upon drying, leaving the neutral, water insoluble polymer. Similarly, suitable solvents may be selected which will dissolve the components of the polymer layer and which will evaporate after coating. The polymer layer may be coated onto the substrate using a variety of conventional, well known coating techniques such as extrusion die, doctor knife, wire wound bar, spin coating; printing techniques such as gravure printing, lithographic printing; or simply wiping with a brush, sponge or other applicator.

AQUEOUS INKS

In the process of the present invention, the aqueous ink is preferably applied to the non-photosensitive layer using ink jet printing techniques. Ink jet printing is a non-impact printing process in which an electronic signal produces droplets of ink that are deposited on a substrate. Ink jet printers are broadly utilized as output for personal and other computers due to their reliability, print quality, low cost, relatively quiet operation and graphics capability. Ink jet printers apply ink in very small drops allowing for potentially high resolution image formation. They also have potential for high throughput in very fast systems affording a deposition rate of in excess of a million drops per second per nozzle. Further, ink jet systems are less expensive than any other currently available commercial system that allows high speed generation of patterns by bit mapped graphics. These attributes also make ink jet printing an attractive digital method for generating images such as in computer driven patterning systems.

Although ink jet printing is the preferred method of applying the aqueous ink layer, it is to be understood that the invention is not limited to ink jet printing. Rather, the imagewise layer may also be applied with conventional writing implements (e.g. felt tip pens, fountain pens, paint brushes) or by other techniques known in the art such as screen printing. It will be apparent that the particular technique of applying the aqueous ink will depend upon the desired application and the demands thereof. For example, the use of pens or brushes would be preferred for application of the teachings herein to novelty items, arts and craft applications, etc., whereas the use of ink jet or screen printing would be preferable for more demanding commercial applications requiring higher resolution.

The aqueous inks suitable for use in the present invention comprise an aqueous carrier medium and a salt-forming agent. Other components may be present in the inks as discussed hereinbelow.

Aqueous Carrier Medium

The aqueous carrier medium comprises water (preferably deionized water) or a mixture of water and at least one water soluble organic solvent. Most preferred are organic solvents having at least one hydroxyl group (diethylene glycol, triethylene glycol, butyl carbitol, etc.). Selection of a suitable mixture of water and water soluble organic solvent depends upon the requirements of the specific application, such as desired surface tension and viscosity, drying time of the ink, and the composition of the non-photosensitive polymer layer.

The aqueous carrier medium will usually contain from about 5% to about 95% water, with the remainder (i.e., 95% to about 5%) being the water soluble organic solvent. For ink jet printing applications, the preferred ratios are approximately 60% to about 95% water, based on the total weight of the aqueous carrier medium. Higher concentrations of organic solvent may result in poor print quality. Lower concentrations will lead to drying out of the printhead or "crusting" of the ink.

The aqueous carrier medium is present in the range of approximately 10 to 99%, preferably approximately 65 to 99% and most preferably approximately 85 to 98.5%, based on total weight of the ink. The amount of aqueous carrier medium in a particular ink will largely be dependent upon the amount of salt-forming agent needed to form the soluble polymer salt. The presence of other ink ingredients as described herein will also influence the concentration of the aqueous carrier medium.

Salt-Forming Agents

The salt-forming agent is selected based upon its ability of reacting with the acid or amine moieties on the polymer to form an aqueous soluble salt. For acid containing polymer layers, the preferred salt-forming agents are organic or inorganic bases, such as alkali metal hydroxides (lithium, sodium, and potassium hydroxide); alkali metal carbonates and bicarbonates (sodium and potassium bicarbonate and carbonate); organic amines (mono-, di-, tri-methylamine, morpholine, N-methyl morpholine); organic alcohol amines (dimethylethanolamine, methyl diethanolamine, mono-, di-, triethanolamine); ammonium salts (ammonium hydroxide, tetra-alkyl ammonium hydroxide) and pyridine.

For amine containing polymers, a variety of acids may be used as the salt-forming agents. Useful acids include organic acids (acetic acid, propionic acid, formic acid, oxalic acid); hydroxylated acids (glycolic acid, lactic acid); halogenated acids (hydrochloric acid, hydrobromic acid); and inorganic acids (sulfuric acid, phosphoric acid, nitric acid).

The amount of salt-forming agent in the aqueous ink must be sufficient to form a salt with the polymer in the non-photosensitive layer, which will vary depending upon the particular salt-forming agent selected, the composition of the non-photosensitive polymer layer, the thickness of the polymer layer, etc. One of ordinary skill in the art is capable of determining the optimum amount of salt-forming agent for a given application by routine experimentation. Generally, the salt-forming agent will be present in a range of 1-90% by weight based upon the total weight of the ink composition.

Other Ingredients

In certain applications, it may be desirable for the ink to contain a colorant to give a visual indication of the image prior to the development step. Suitable ink colorants must be water-soluble or water-dispersable so as to be removed during the wash-off step, and may comprise dyes or pigments. If the pigment is not itself water-dispersable, a dispersant may be used. The colorant must also be compatible with the other ink ingredients so as to remain dissolved or dispersed therein.

Other ingredients, such as biocides, humectants, surfactants, viscosity modifiers, etc. may be present in the ink composition, if desired. Such compounds have long been used in ink formulations, particularly ink jet inks. Surfactants may be used to control the interactions between the ink and the polymer layer. Such interactions in turn determine the size and the shape of the dots. Many of water compatible surfactants are commercially available and may be selected from McCutcheon's Emulsifiers and Detergents, published by Manufacturing Confectioners Publishing Company, Glen Rock, NJ. Care must be exercised, however, to ensure that the final ink composition does not interfere with the formation of a water-soluble salt in the imaged areas of the polymer layer.

Ink Properties

For ink jet ink applications, the physical properties of the ink should be compatible with a wide range of ejecting conditions, i.e., driving voltage and pulse width for thermal ink jet printing devices, driving frequency of the piezo element for either a drop-on-demand device or a continuous device, and the shape and size of the nozzle.

For ink jet printing, the ink needs to be thin with viscosity matching the printhead design to ensure smooth delivery of ink droplets. Useful viscosities for the typical printheads are below 20 cP, preferably below 10 cP at 200° C. Surface tension is an important property because it prevents the ink from dripping out of the nozzles and helps maintain droplet integrity to avoid splattering. Useful surface tension ranges from 18-80 dyne/cm, preferably 25-70 dynes/cm at 200° C. Other viscosity and surface tension criterion will be applicable for other methods of applying the ink to the polymer layer and will be well known to those skilled in such methods.

Some of the salt-forming agents listed above can adversely react with the materials commonly used for printheads in ink jet ink printers because of their extreme ph values. Printheads used in thermal excitation printers in particular are susceptible to attack by such compounds. In such circumstances, it is possible to mask the salt-forming agent with a relatively volatile component to alleviate the adverse effects and then evaporate the volatile compound with heat after the ink has been applied to release the salt-forming agent.

As an example, a high boiling or solid base, such as triethanolamine (boiling point 190°-193° C./5mm), can be neutralized with a more volatile or lower boiling acid, such as acetic acid (boiling point 1160°-118° C.), to a more reasonable pH and significantly deactivated at the same time. After the ink is applied to the polymer layer, heat is applied for a short time to decompose the neutralized amine, flash off the volatile acetic acid, and release the free amine which reacts with the polymer layer to form the soluble polymer salt.

WASH-OFF DEVELOPMENT

After the element has been imaged with the aqueous ink, the imaged areas are removed with an aqueous solution, preferably water. If necessary, the resulting aqueous solution may contain a low level of a salt-forming agent, preferably the same agent used in the aqueous ink to facilitate the removal of the imaged areas without deleteriously affecting the non-imaged areas. Optionally, low levels of water soluble surfactants may be present in the process solution to facilitate the interaction between the salt-forming agent and the acid or amine containing polymer.

INDUSTRIAL APPLICABILITY

This invention is particularly useful in the field of graphic arts, such as printing plate, imagesetting, color proofing (including overlays and surprints), and in the field of electronics, such as solder masks, resists for printed circuit boards, dielectric layers, etc.

The invention is also suitable for use in producing a photomask for conventional imaging applications and may advantageously be integrated into such a system by laminating a precolored element of the present invention to a photopolymer composition, for example. The composite structure is then imaged as described herein to create the mask, and is then exposed in the normal manner. After removal of the photomask, the exposed element may then be processed in the usual way.

The present invention also has a variety of applications in novelty items, arts and crafts items, decorative items, etc. which may be imaged by the consumer with a personal message or drawing, or may be preimaged and merely developed by the consumer by washing.

EXAMPLES

This invention will be further illustrated by, the following detailed examples of various embodiments, in which parts and percentages are by weight unless otherwise noted.

EXAMPLE 1

A non-photosensitive blue layer consisting of 1 part dimethylaminoethyl methacrylate/methyl methacrylate (43/57 by weight) polymer, 0.1 part Atlasol Blue 5 dye (Krompton & Knowles Co.; Reading, PA) and 7.0 parts methylene chloride was prepared by mixing to completely dissolve the solids.

This composition was coated on 0.0076 cm thick, resin subbed Mylar ® base (E. I. du Pont de Nemours & Co.; Wilmington, DE) using a 0.008" wire wound coating bar. After drying, the coating was printed with an ink of 5% glacial acetic acid solution in deionized water using a Hewlett-Packard DeskJet ink jet printer (Hewlett-Packard Co., Palo Alto, CA). Immediately after printing, the sample was rinsed with running tap water. Within seconds, clear images of alphanumerical characters and various dot patterns with sharp edges on a bright blue background were developed.

EXAMPLE 2

Example 1 was repeated, except that a non-photosensitive black layer consisting of 1.0 part FW18, Carbon Black Pigment (Degussa ® Corp.; Ridgefield Park, NJ), 1.0 part AB 1030 dispersant, 50% solution in toluene (E. I. du Pont de Nemours & Co.; Wilmington, DE), 1.5 parts polymer from Example 1, and 17.0 parts methylene chloride was used instead of the blue layer and the aqueous ink consisted of 3% glacial acetic acid solution in deionized water. The black layer was prepared by mixing the components with 25 grams of 3/32 inch steel shots in a glass vial and milled for 2 hours.

Immediately after printing, the image of alphanumerical characters and dot patterns with very sharp edges on a black ground was developed under a running tap water. Some gentle rubbing was needed to clear the imaged areas.

EXAMPLE 3

Example 2 was repeated with the following exceptions: A yellow layer was used as the non-photosensitive layer which consisted of 0.6 part Lionol ® Yellow NBRT-T Pigment (Toyo Ink America Inc., Englewood Cliffs, NJ), 0.6 part AB 1030 dispersant, 50% solution in toluene, 1.0 part polymer from Example 1, and 15.2 parts methylene chloride.

A clear image with sharp edges on a bright yellow background was obtained upon development.

EXAMPLE 4

Example 2 was repeated with the following exception: A magenta layer was used as the non-photosensitive layer consisting of 0.6 part Monastral ® Magenta RT-143D Pigment (Ciba Geigy Corp., Newport, DE), 0.6 part AB 1030 dispersant, 50% solution in toluene, 1.0 part polymer from Example 1, and 15.2 parts methylene chloride.

A clear image with sharp edges on a bright magenta background was obtained upon development.

EXAMPLE 5

Example 2 was repeated with the following exceptions: A black layer consisting of 2.75 parts Microlith black C-WA, 55% carbon black pigment and 45% alkali soluble resin (Ciba Geigy Corp., Newport, DE), 6.5 parts Carboset ® XL-37, 35% solution (B. F. Goodrich Co., Cleveland, OH), 0.9 part ammonium hydroxide solution, 29.6% ammonia, 5.0 parts isopropanol, and 14.85 parts deionized water was used as the non-photosensitive layer. This composition was coated on the base using a 0.0111 wire wound bar. The aqueous ink consisted of 30% triethanolamine in deionized water.

An image of alphanumerical characters and dot patterns with sharp edges on a black background was developed by washing off the imaged areas with running tap water.

EXAMPLE 6

Example 5 was repeated with the following exception: A yellow layer consisting of 2.5 parts Microlith ® Yellow 3G-WA, 60% pigment and 40% alkali soluble resin (Ciba Geigy Corp., Newport, DE), 7.0 parts Carboset ® XL-37, 35% solution (B. F. Goodrich Co., Cleveland, OH), 0.9 part ammonium hydroxide solution, 29.6%, 5.0 parts isopropanol, and 14.6 parts deionized water was used as the non-photosensitive layer.

An image of alphanumerical characters and dot patterns with sharp edges on a bright yellow background was developed by washing off the imaged areas with running tap water.

EXAMPLE 7

A high resolution toned cyan image was prepared by coating the black non-photosensitive composition of Example 5 on the plain side of a 1 micron thick, silicone treated Mylar ®. After drying, the layer was printed and developed as described in Example 5. The resulting high density black image was used as a photomask for the photosensitive Cromalin ® proofing film (E. I. Du Pont Co., Wilmington, DE).

The positive working Cromalin ® film was laminated on a glossy coated paper stock. The cover sheet was removed, and the photomask with the image facing outside was carefully laminated directly onto the photosensitive composition. The assemblage was exposed for 90 seconds on an exposure unit, Douthitt Light Integrator, Magic 782 (Douthitt Corp., Detroit, MI). The mask was removed and the imagewise polymerized coating was toned with the standard Cromalin ® cyan toner using a cotton rag. The excess toner was removed to give a sharp cyan image.

EXAMPLE 8

A 3% solution of National 28-2930 polymer (National Starch And Chemical Corp., Bridgewater, NJ) in methyl ethyl ketone containing a trace amount of a silicone based flow agent was spin coated on a 0.15mm thick, grained and anodized aluminum substrate. The coating weight was about 1 g/m2. The coating was printed with an ink containing 30% of triethanolamine and 10% of butyl carbitol in deionized water using a Hewlett-Packard DeskJet ink jet printer.. The substrate was heated to about 125° F. (52° C.) on the surface and air blown from the top with a fan during the printing to assist evaporation of solvent. The image was developed by wiping the surface with a damp cloth. A clean negative image of alphanumerical characters was obtained.

EXAMPLE 9

A 3% solution of Carboset ® XL-44 (B. F. Goodrich Co., Cleveland, OH) in methyl ethyl ketone containing the silicone based flow agent was spin coated, dried, printed, and developed as described in Example 8. A clear image of alphanumerical characters with sharp edges was obtained.

EXAMPLE 10

The polyvinyl butyral polymer Mowital ® B30T (Hoechst AG) was esterified with phthalic anhydride to give a polymer having between 0.9–1.6 meq of acid functions per gram of polymer. A 3% solution of the resulting polymer in methyl ethyl ketone was spin coated, dried, printed, and developed as described in Example 8. A clear image of alphanumerical characters with very sharp edges on an aluminum substrate was obtained.

We claim:

1. A method for preparing wash-off images comprising the sequential steps of:
   (a) providing a non-photosensitive layer, said non-photosensitive layer comprising a substantially non-crystalline water-insoluble polymer selected from the group consisting of acid containing polymers having at least 0.4 milliequivalents of acid functions per gram of polymer and amine containing polymers having at least 0.4 milliequivalents of amine functions per gram of polymer;
   (b) applying an aqueous ink imagewise to the non-photosensitive layer to from a salt of the polymer in the ink applied areas, said aqueous ink comprising an aqueous carrier medium and a salt-forming agent; and
   (c) washing the non-photosensitive layer with an aqueous medium to remove the images areas of the non-photosensitive layer.

2. The method of claim 1 wherein the water-insoluble polymer is an acid containing polymer and the salt-forming agent is a base.

3. The method of claim 2 wherein the base is selected from the group consisting of alkali metal hydroxides, organic amines, organic alcohol amines, ammonium salts and pyridine.

4. The method of claim 1 wherein the polymer is an amine containing polymer and the salt-forming agent is an acid.

5. The method of claim 4 wherein the acid is selected from the group consisting of organic acids, hydroxylated acids, halogenated acids and inorganic acids.

6. The method of claim 1 wherein the polymer has 0.4 to 11.0 meq acid or amine functions per unit weight of the polymer.

7. The method of claim 1 wherein the non-photosensitive layer further comprises a colorant.

8. The method of claim 1 wherein the non-photosensitive layer further comprises at least one compound selected from the group consisting of plasticizers, polymeric modifiers and adhesion promoters.

9. The method of claim 1 wherein the aqueous ink further comprises a colorant.

10. The method of claim 1 wherein the aqueous ink further comprises a surfactant.

11. The method of claim 1 wherein the aqueous carrier medium comprises water of a mixture of water and at least one water soluble organic solvent.

12. The method of claim 11 wherein the water soluble organic solvent has at least one hydroxyl group.

13. The method of claim 1 wherein the aqueous ink is applied with an ink jet printer.

14. The method of claim 1 wherein the ink is applied using a felt pen or a fountain pen.

15. The method of claim 1 wherein the aqueous medium is water.

* * * * *

UNITED STATES PATENT AND TRADEMARK OFFICE
CERTIFICATE OF CORRECTION

PATENT NO. : 5,270,078
DATED : December 14, 1993
INVENTOR(S) : Peter Walker, Sheau-Hwa Ma and Andrew E. Matthews It is certified that error appears in the above—identified patent and that said Letters Patent is hereby corrected as shown below:

In claim 1, Column 14, line two, "from" should read --form--.

In claim 1, Column 14, line 7, "images" should read --imaged--.

Signed and Sealed this

Tenth Day of May, 1994

Attest:

BRUCE LEHMAN

Attesting Officer       Commissioner of Patents and Trademarks